(12) United States Patent
Yeh et al.

(10) Patent No.: US 7,777,184 B2
(45) Date of Patent: Aug. 17, 2010

(54) METHOD FOR PHOTORESIST CHARACTERIZATION AND ANALYSIS

(75) Inventors: Hsiao-Wei Yeh, Hsinchu County (TW); Jen-Chieh Shih, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 288 days.

(21) Appl. No.: 11/866,008

(22) Filed: Oct. 2, 2007

(65) Prior Publication Data

US 2009/0057554 A1 Mar. 5, 2009

Related U.S. Application Data

(60) Provisional application No. 60/969,010, filed on Aug. 30, 2007.

(51) Int. Cl.
*G01N 23/00* (2006.01)
*G21K 7/00* (2006.01)

(52) U.S. Cl. .......................... 250/307; 430/5; 430/170; 430/311; 430/270.1; 430/191; 430/192; 430/193; 356/636; 356/601; 356/237.5

(58) Field of Classification Search .................. 250/307; 430/5, 170, 311, 270.1, 191–193; 356/636, 356/601, 237.5

See application file for complete search history.

(56) References Cited

U.S. PATENT DOCUMENTS

| 4,771,017 | A | 9/1988 | Tobin et al. |
|---|---|---|---|
| 5,363,171 | A | 11/1994 | Mack |
| 5,427,878 | A | 6/1995 | Corliss |
| 5,607,800 | A | 3/1997 | Ziger |
| 6,015,652 | A | 1/2000 | Ahlquist et al. |
| 6,078,738 | A | 6/2000 | Garza et al. |
| 6,081,659 | A | 6/2000 | Garza et al. |
| 6,115,108 | A | 9/2000 | Capodieci |
| 6,548,219 | B2 | 4/2003 | Ito et al. |
| 6,556,652 | B1 | 4/2003 | Mazor et al. |
| 7,046,342 | B2 | 5/2006 | Hinsberg, III et al. |
| 7,110,491 | B2 | 9/2006 | Mazor et al. |
| 7,567,353 | B2* | 7/2009 | Bischoff et al. ............. 356/636 |
| 2008/0068706 | A1* | 3/2008 | Goodman .................. 359/368 |

OTHER PUBLICATIONS

"A novel miniaturized PCR multi-reactor array fabricated using flip-chip bonding techniques", Zou, Z-Q, Chen, X., Jin, Q-H, Yang, M-S, Zhao, J-L, J. Micromech. Microeng vol. 15, pp. 1476-1481, 2005.*

"Osteoprogenitor response to defined topgraphis with nanoscle depths" Dalby, M.J., McCloy, D., Robertson, M., Wilkinson, C.D.W and Oreffo, R.O.C., Biomaterials vol. 27, pp. 1306-1315.*

(Continued)

*Primary Examiner*—Jack I Berman
*Assistant Examiner*—Meenakshi S Sahu
(74) *Attorney, Agent, or Firm*—Haynes and Boone, LLP (57) ABSTRACT

A method for photoresist characterization includes forming a photoresist on a supportive structure; and characterizing the photoresist using a metrology tool selected from the group consisting of a transmission electron microscope (TEM), a scanning electron microscope (SEM), an atomic force microscope (AFM), a small angle X-ray scattering (SAXS) and a laser diffraction particle analyzer.

23 Claims, 4 Drawing Sheets

OTHER PUBLICATIONS

K. Gopalkrishnan, "Use of Negative Staining Technique and Electron Microscopy for the Study of Structural Anomalies of Outer Dense Fibres of Human Flagellum", Indian Academy of Sciences, J. Biosci., 23, No. 5, Dec. 1998, pp. 613-616.

Wu, Wen-Li, et al., "Small Angle X-ray Scattering Metrology for Sidewall Angle and Cross Section of Nanometer Scale Line Gratings," ULSI, Richardson, TX, Mar. 18, 2005, 49 pages.

Jones, Ronald L., et al., "Cross Sectional Measurements of Dense High Aspect Ratio Patterns using CDSAXS," Metrology, Inspection and Process Control for Microlithography, XIX, SPIE, May 2005, pp. 404-411.

Jones, Ronald L., et al. "Pattern Fidelity in Nanoimprinted Films using CD-SAXS," Emerging Lithographic Technologies IX, Proceedings of SPIE 5751, Bellingham, WA, May 2005, pp. 415-422.

Wang, Chengqing, et al., "small Angle X-ray Scattering Measurements of Lithographic Patterns with Sidewall Roughness from Vertical Standing Waves," Applied Physics Letters 90, 193122, May 10, 2007, 3 pages.

* cited by examiner

METHOD FOR PHOTORESIST CHARACTERIZATION AND ANALYSIS

CROSS-REFERENCE

This application is related to commonly-assigned U.S. Provisional Application No. 60/969,010 filed Aug. 30, 2007, the disclosure of which is hereby incorporated herein by reference.

BACKGROUND

Photolithography is a common process used to form integrated circuits. During a photolithography process, a photoresist material is formed on a substrate such as a semiconductor wafer and is exposed with a predefined pattern to be transferred to the substrate. The characteristics and properties of the photoresist material will directly affect the quality of the photolithography patterning process and the performance of the thus-formed integrated circuits. This becomes especially important as the pattern sizes continue to shrink, such as 65 nanometers, 45 nanometers, or below.

BRIEF DESCRIPTION OF THE DRAWINGS

Aspects of the present disclosure are best understood from the following detailed description when read in conjunction with the accompanying figures. It is noted that, in accordance with the standard practice in the industry, various features are not drawn to scale. In fact, the dimensions of various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
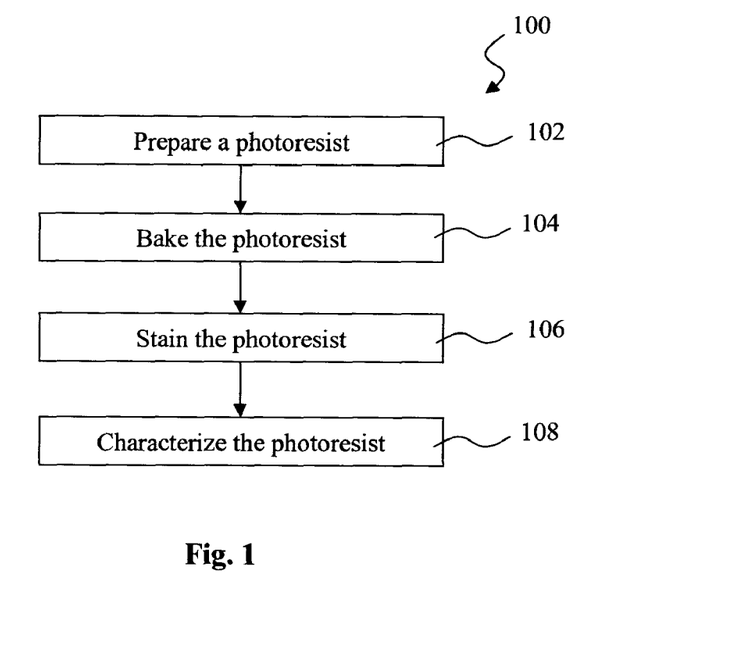
FIG. 1 is a flowchart showing one embodiment of a method of photoresist characterization.
Figure 2:
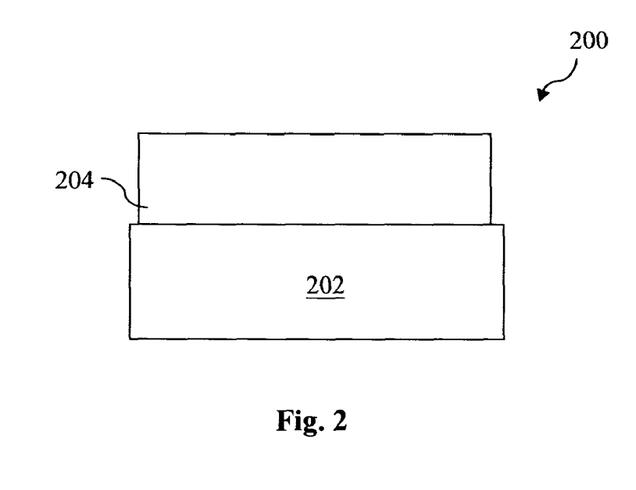
FIGS. 2 through 4 are schematic views of one embodiment of a photoresist sample prepared for characterization.
Figure 3:
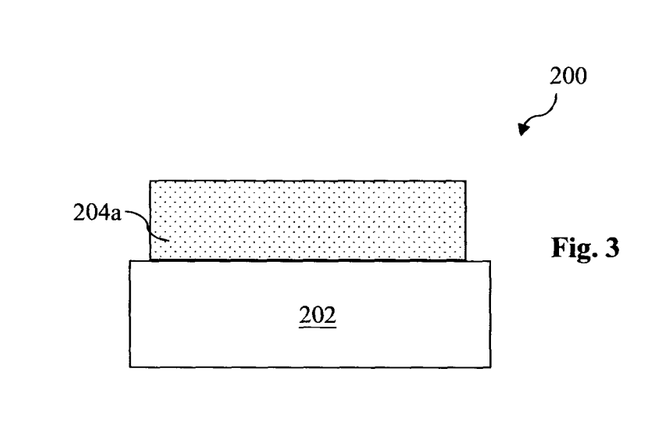
Figure 4:
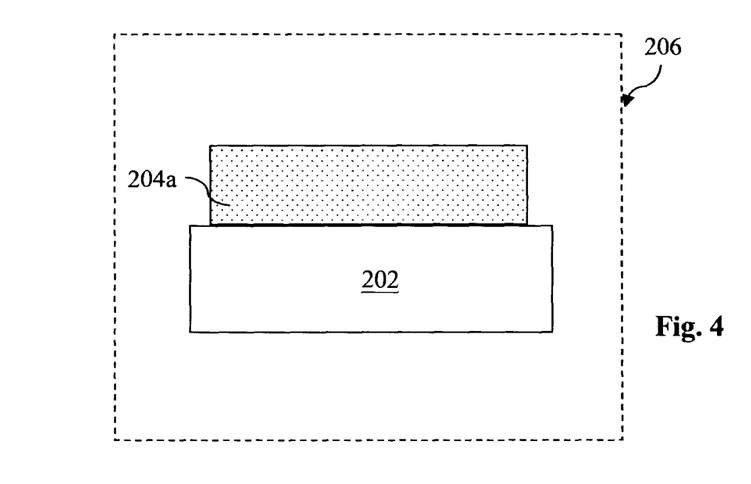

FIG. 1 is a flowchart showing one embodiment of a method of photoresist characterization. FIGS. 2 through 4 are schematic views of one embodiment of a photoresist prepared for characterization. With reference to FIGS. 1-4 and further reference to FIGS. 5-12, a method 100 for photoresist characterization is described in various embodiments.

Figure 5:
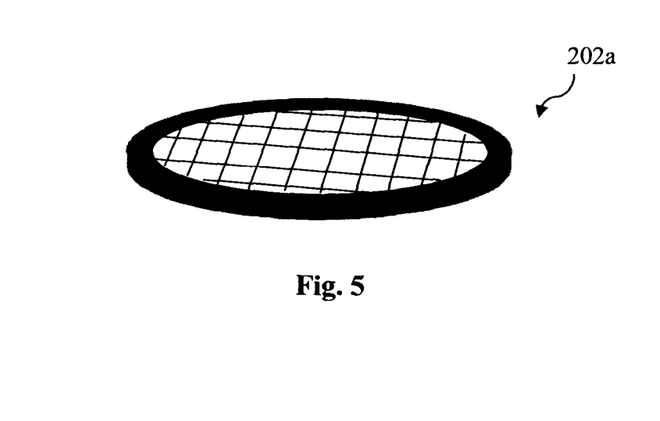
FIG. 5 is a schematic view of one embodiment of a substrate for photoresist characterization.

Referring to FIGS. 1 and 2, the method 100 begins at step 102 by preparing a photoresist sample 200. The preparation of the photoresist sample includes providing a substrate 202. The substrate 202 is designed to properly hold a photoresist for various photoresist characterizations. The substrate 202 may include a silicon wafer, a glass, or a multilayer structural film in various embodiments. In another embodiment, the substrate 202 may use a structure 202a having a copper net coated with a carbon film as shown in FIG. 5, for TEM characterization. The copper net has a dimension sufficient to be manipulated in a metrology tool for photoresist characterization. For example, the copper net may have a diameter about 2 mm. In another embodiment, the substrate 202, such as silicon wafer, glass, or multilayer structural film, may be initially used to form a photoresist thereon. The photoresist is later transferred to the structure 202a before characterizing the photoresist by TEM.

A photoresist material 204 is disposed on the substrate 202. The photoresist 204 may have a thickness less than about 150 nm in one example. The prepared photoresist sample 200 is thus suitable for two-dimensional analysis from a top view along a direction perpendicular to the substrate 202. The photoresist includes a polymeric material to be formed as a matrix, a photosensitive material, and a solvent. In one embodiment, the photoresist is chemical amplifier photoresist (CA or CAR). The CA photoresist includes a photo acid generator (PAG) as the photosensitive material. A photon induces decomposition of PAG and forms a small amount of acid, which further induces a cascade of chemical transformations in the resist film, usually during a post-exposure bake process. The CA photoresist may further include other additives such as a quencher, disposed in the photoresist in order to improve critical dimension (CD) control. In the present embodiment, the photoresist 204 disposed on the substrate is in a liquid state and the characterization process is applied to this photoresist material while in the liquid state.

Alternatively, the photoresist sample 204 may not only include photoresist material, but other material layers may be formed underlying and/or overlying the photoresist material to simulate the real photoresist environment in a photolithography patterning process. For example, a bottom anti-reflective coating (BARC) layer is formed on the substrate 202 and the photoresist 204 is formed on the BARC layer. A top coating layer may be further formed on the photoresist 204. Other underlying and overlying may be additionally or alternatively formed below or over the photoresist layer 204.

Figure 6:
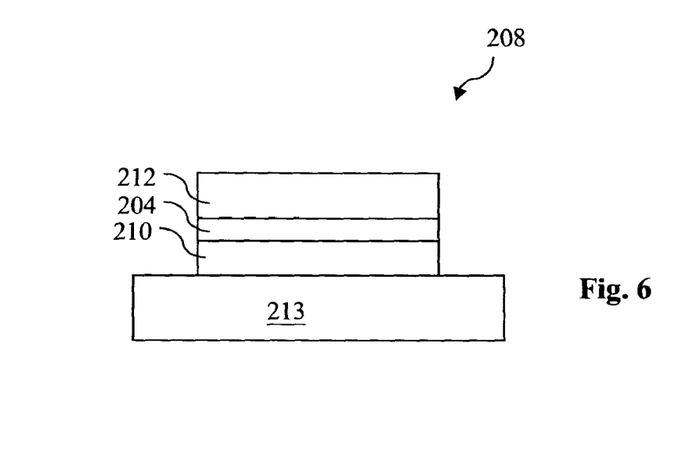
FIGS. 6 through 8 are schematic views of another embodiment of a photoresist sample prepared for characterization.
Figure 7:
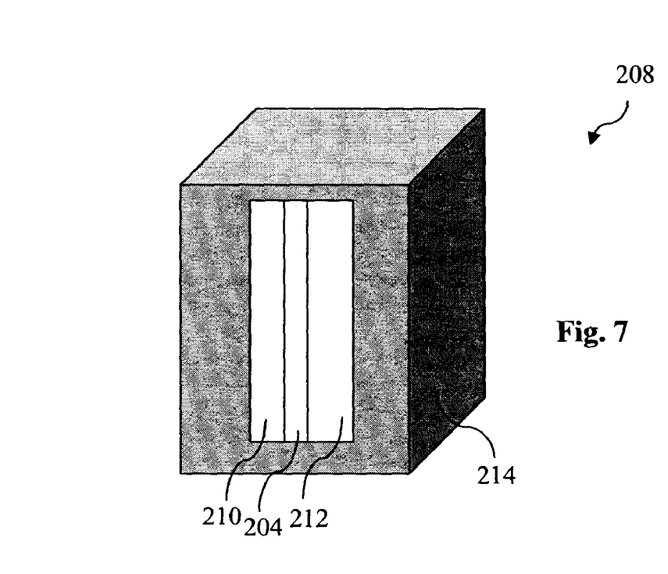
Figure 8:
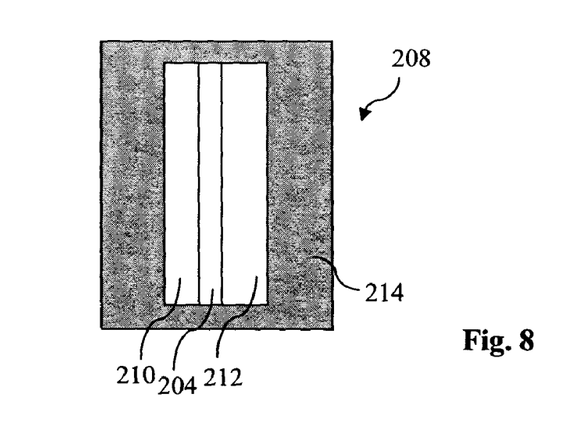
Figure 9:
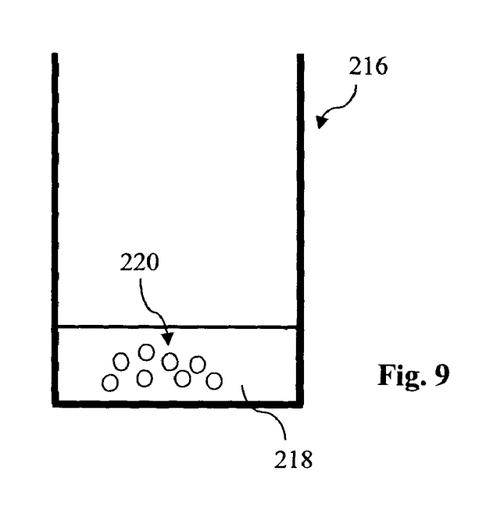
FIGS. 9 through 10 are schematic views of one embodiment of a staining process applied to a photoresist sample.
Figure 10:
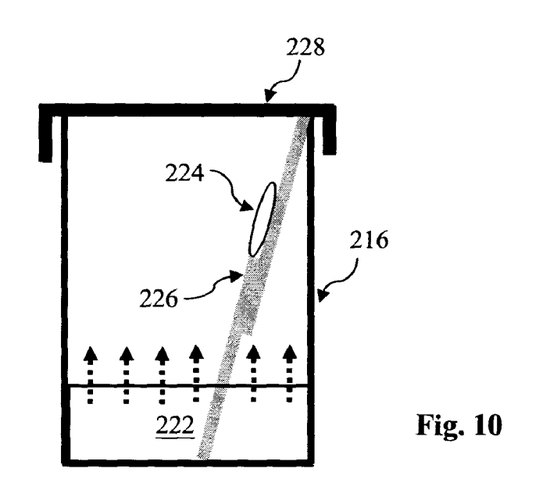

In another embodiment, a photoresist sample 208 is prepared in an alternative way for depth profile (along a z-direction perpendicular to the substrate) as shown in FIGS. 6 through 8 and further described below. Referring to FIG. 6, a layer of photoresist 204 is formed on a material layer 210. Another material layer 212 is further formed on the photoresist 204 to cover the photoresist. The material layers 210 and 212, also referred to as protective layers, are configured to sandwich the photoresist 204 and protect the photoresist from both sides. In one embodiment, the protective layers 210 and 212 include polymer such as polystyrene, epoxy, or other polymeric material. The photoresist 204 of FIG. 6 may be substantially similar to the photoresist 204 of FIG. 2, in terms of composition, and/or formation. For example, the photoresist sample 208 may not only include the photoresist material 204. Other material layers may be formed underlying and/or overlying the photoresist layer. In various examples, a bottom anti-reflective coating (BARC) layer may be formed on the protective layer 210 and/or the photoresist 204 is formed on the BARC layer. A top coating layer may be further formed on the photoresist 204. The sandwiched photoresist sample 208 may be formed on a substrate structure 213 with a sequential process such as: forming the material layer 210 on the substrate structure 213, forming the photoresist 204 on the material layer 210 and then forming the material layer 212 on the photoresist material 204. The substrate structure 213 may be a glass or other proper material chemical compatible and mechanical supportable to the photoresist sample.

Referring to FIG. 7, the photoresist sample 208, including the photoresist layer 204, (which may further including an underlying layer and/or an overlying layer), the material layer 210, and the material layer 212, is further mounted in a wrapping material layer 214 as shown in FIG. 7. The wrapping material layer 214 includes epoxy in one example. The mounted photoresist sample 208 is then sectioned into a thin layer of the photoresist sample with the photoresist material 204 configured as shown in FIG. 8. The sectioned photoresist sample 208 can be used for analyzing depth profile defined in a z-direction from the material layer 210 to the material layer 212, perpendicular to the substrate 213 with regarding to FIG. 6.

Still referring to FIGS. 1 and 2, the method 100 proceeds to step 104 for baking the photoresist sample. The photoresist 204 is baked to remove the solvent. The photoresist sample can be the photoresist sample 200 of FIG. 2 or the photoresist sample 208 of FIG. 8. As to the sectioned photoresist sample 208, it may be baked before mounted as shown in FIG. 6 or before sliced as shown in FIG. 7. The baking process may have a baking temperature ranging between about 70 C and about 150 C. The baking process may have a baking duration less than about 2 minutes in one embodiment. The photoresist material 204 may be characterized at such a dry state, after the baking process, by a metrology tool such as a transmission electron microscope (TEM), a scanning electron microscope (SEM), and/or an atomic force microscope (AFM).

Referring to FIGS. 1 and 3, the method 100 then proceeds to step 106 by staining the photoresist 204 using a staining agent. This staining step is applicable to the photoresist sample prepared for TEM characterization in order to achieve better imaging contrast. A staining agent is incorporated into the photoresist during the staining process. The photoresist 204 is transferred to the stained photoresist 204a after the staining process as shown in FIG. 4. The staining agent includes $RuO_4$, $OsO_4$, $I_2$, $I_3^-$, uranyl acetate, and/or lead citrate in various embodiments. The staining agent can be applied to the photoresist in different techniques. In first embodiment, a staining agent is applied to the photoresist via vapor, as described below with reference to FIGS. 9 and 10. A staining agent 220, such as one of $RuO_4$, $OsO_4$, $I_2$, $I_3^-$, uranyl acetate and lead citrate, is introduced into a solvent 218 in a container 216 to form staining solution 222. The photoresist sample 224 is positioned inside the container 216 and may be further secured by a support feature 226. The photoresist sample 224 may be a photoresist disposed on a substrate designed for two-dimensional characterization such as the photoresist sample 200 of FIG. 2. The photoresist sample 224 may be a photoresist wrapped by a polymeric material and further sliced for depth profile such as the photoresist sample 208 of FIG. 8. The container 216 may be further covered or sealed by a cover 228 for enhanced vapor environment. The staining solution 222 is heated to a proper temperature to generate vapor in the container 216 to stain the photoresist sample 224.

Figure 11:
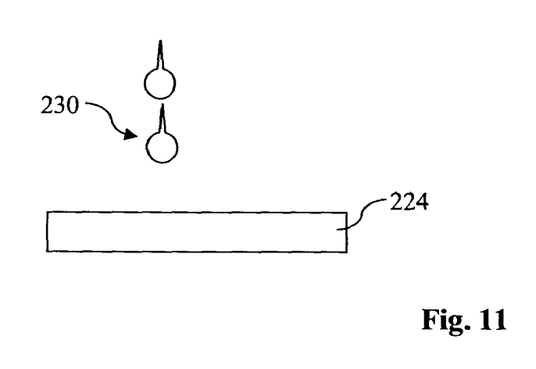
FIGS. 11 through 12 are schematic views of another embodiment of a staining process applied to a photoresist sample.
Figure 12:
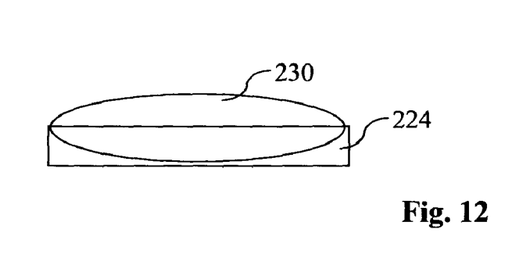

In second embodiment, a staining agent is applied to the photoresist via liquid, as described below with reference to FIGS. 11 and 12. A staining solution 230 containing a staining agent is applied to the photoresist sample 224 as shown in FIG. 11. The staining agent includes one of $RuO_4$, $OsO_4$, $I_2$, $I_3^-$, uranyl acetate and lead citrate. The staining agent in the liquid spreads on the top surface of the photoresist sample 224 as shown in FIG. 12 and is further absorbed into the photoresist. The solvent may be removed thereafter by another baking process. The staining agent can be incorporated into the photoresist sample 224 by other proper techniques or proper procedures. For example, the staining agent is directly mixed with the photoresist solution before forming the photoresist on a substrate or before sandwiched in polymeric protective layers.

The staining agent and staining process may be implemented according to various characterization processes. In one embodiment, vapor $RuO_4$ at a temperature less than about 70 C is applied to the photoresist sample for less than about 30 minutes for PAG or polymer distribution analysis. In another embodiment, liquid $RuO_4$ at a temperature ranging between about 15 C and about 25 C is applied to the photoresist for less than about 10 minutes for PAG or polymer distribution analysis. In another embodiment, vapor $OsO_4$ at a temperature less than about 70 C is applied to the photoresist for less than about 48 hours for PAG or polymer distribution analysis. In another embodiment, liquid $OsO_4$ at a temperature ranging between about 15 C and about 25 C is applied to the photoresist for less than about 60 minutes for PAG or polymer distribution analysis. In another embodiment, vapor $I_2$ at a temperature less than about 50 C is applied to the photoresist for less than about 3 hours for polymer distribution analysis. In another embodiment, liquid $I_3^-$ at a temperature ranging between about 15 C and about 25 C is applied to the photoresist for less than about 60 minutes for polymer distribution analysis. In another embodiment, liquid uranyl acetate at a temperature less than about 60 C is applied to the photoresist for less than about 60 minutes for polymer distribution analysis. In another embodiment, liquid lead citrate at a temperature less than about 60 C is applied to the photoresist for less than about 60 minutes for polymer distribution analysis. Various staining agents and staining parameters may be tuned and employed for various characterization purposes according to aspects of the present disclosure.

Referring to FIGS. 1 and 4, the method proceeds to step 108 by characterizing the prepared photoresist sample—either the photoresist sample 200 of FIG. 2 or the photoresist sample 208 of FIG. 8. The characterization step may utilize various metrology tools such as TEM, scanning electron microscope (SEM), or atomic force microscope (AFM). In various embodiments, the characterization may include characterizing the photoresist in two-dimension from a top view (e.g., along a direction perpendicular to the substrate) or depth profile (e.g., along the direction perpendicular to the substrate). In one embodiment, the photoresist sample formed on a substrate may be characterized by TEM, SEM and/or AFM for 2-D profile. The photoresist sample sandwiched and sectioned may be characterized by TEM, SEM and/or AFM for depth profile.

Alternatively, the characterization step may alternatively use small angle X-ray scattering (SAXS), and/or laser diffraction particle analyzer. When SAXS or laser diffraction particle analyzer is used, the photoresist is instead formed in a cell configured to hold the photoresist in solution. The cell to hold the photoresist in liquid state may use material substantially transparent to the X-ray employed by SAXS and/or laser beam by the laser diffraction particle analyzer. When SAXS or laser diffraction particle analyzer is used, the baking process and the staining process are eliminated.

Various characterization embodiments are provided below. In one embodiment, the characterization includes a two-dimensional distribution such as PAG distribution, quencher distribution, or other additive distribution. In another embodiment, the characterization includes a two-dimensional morphology such as polymer morphology including polymer phase separation microstructure, polymer uniformity, polymer micro-structure (random or block copolymer structure), or a distribution of a functional group of the photoresist. In another embodiment, the characterization includes the remaining solvent distribution in two-dimension and/or depth profile. In another embodiment, the characterization includes depth profile such as PAG distribution, quencher distribution, or other additive distribution. In another embodiment, the characterization includes depth profile (morphology) such as polymer phase separation microstructure, polymer uniformity, or a distribution of a functional group of the photoresist. The characterization may include the distribution of the remaining solvent distribution along the direction perpendicular to the substrate. The characterization may include analysis of an interface between the photoresist and an underlying layer (an overlying layer) for affinity, adhesion, intermixing and other properties of the interface. In one embodiment, the underlying layer includes a bottom anti-reflective coating (BARC) film used to reduce reflection. In another embodiment, the overlying layer includes a top coating layer disposed on the photoresist for improving the performance of the photoresist. The characterization may include additive size such as PAG size or quencher size.

In one embodiment, the characterization includes a two-dimensional distribution such as PAG distribution, quencher distribution, or other additive distribution. The characterization may include measuring PAG size, quencher size, or other additive size. The characterization may include a two-dimensional morphology such as polymer morphology (polymer phase separation microstructure, polymer uniformity, and/or polymer micro-structure: random or block copolymer structure), or a distribution of a functional group of the photoresist. The characterization may include the solubility of an additive or the solubility of the photoresist. The characterization may include depth profile such as PAG distribution, quencher distribution, or other additive distribution. The characterization may include depth profile such as polymer phase separation microstructure, polymer uniformity, or a distribution of a functional group of the photoresist. The characterization may include the distribution of the solvent and the polymer in the photoresist.

The disclosed method provides a new method to monitor and analyze the characteristics of a photoresist material. The new method utilizes TEM, SEM, AFM, SAXS and/or laser diffraction particle analyzer in various embodiments. The new method also provides various ways to prepare the photoresist sample for two-dimensional analysis and depth profile analysis. The characteristics include the additive (quencher or PAG) size and distribution, photoresist polymer morphology/uniformity/structure, and interface properties (affinity, adhesion, or intermixing). The method also provides various staining processes and associated staining agents for different characterizing purposes. The disclosed method has various applications including lithography process control and improvement. For example, the line-edge roughness (LER) is related to the PAG distribution in the photoresist and can therefore be analyzed based on the PAG size and/or distribution.

Various changes, substitutions and alterations can be made herein without departing from the spirit and scope of the present disclosure. For example, other photoresist parameters and structures may be characterized and/or extracted, such as PAG aggregation in one example. In another example, the photoresist sample may be further processed by other photolithography processing steps such as exposed, and/or post-exposed baked, before the characterization at step 108. Thus the characterization process may be applied thereafter to analyze the photoresist at that stage for its properties including additive distribution, polymer morphology, solvent distribution and interface properties.

There are various embodiments of the method for a photoresist to be characterized by TEM. In one embodiment, the photoresist may be directly formed on a copper net coated with a carbon film. The photoresist on the copper net is then baked and stained before the characterization. In another embodiment, the photoresist is formed on a substrate, such as a silicon wafer, a glass, or a multilayer film. The photoresist is then baked and is transferred to the copper net for staining and characterization. In another embodiment, the photoresist is formed and baked on a substrate, such as a silicon wafer, a glass, or a multilayer film. The photoresist is then transferred to the copper net for characterization.

Thus, the present disclosure provides a method for photoresist characterization. The method includes forming a photoresist on a supportive structure; and characterizing the photoresist using a metrology tool selected from the group consisting of a transmission electron microscope (TEM), a scanning electron microscope (SEM), an atomic force microscope (AFM), a small angle X-ray scattering (SAXS) and a laser diffraction particle analyzer.

In the disclosed method, the supportive structure may include a substrate selected from the group consisting of a silicon wafer, a glass, a multilayer film, a copper net coated with a carbon film. The forming of the photoresist on a supportive structure may include forming the photoresist positioned between two protective material layers; wrapping the photoresist and the two protective layers by an epoxy material; and slicing the photoresist, the two protective layers and the epoxy material. The forming of the photoresist on a supportive structure may include forming the photoresist in a sample cell being capable of hold the photoresist in liquid state and being compatible to the metrology tool. The method may further include baking the photoresist to remove a solvent in the photoresist, before the characterizing of the photoresist. The method may further include staining the photoresist using a staining agent before the characterizing of the photoresist. The characterizing of the photoresist may include characterizing at least one of photoresist film, photoresist solution, photo-acid generator (PAG) size, PAG distribution, quencher size, quencher distribution, other additive size and distribution, and photoresist solubility. The characterizing of the photoresist may include at least one of characterizing the photoresist in two-dimension from a top view; and characterizing the photoresist for its depth profile from a top view.

The present disclosure also provides a method in another embodiment. The method includes forming a photoresist on a supportive structure; baking the photoresist; staining the photoresist with a staining agent; and characterizing the photoresist using at least one of a transmission electron microscope (TEM), a scanning electron microscope (SEM) and an atomic force microscope (AFM).

In this method, the baking of the photoresist may include a baking temperature ranging between about 70 C and about 150 C; and a baking duration less than about 2 minutes. The staining agent may be selected from the group consisting of $RuO_4$, $OsO_4$, $I_2$, $I_3^-$, uranyl acetate, lead citrate, and combinations thereof. In one example, the staining of the photoresist includes applying the staining agent in a liquid state to the photoresist. In another example, the staining of the photoresist includes applying the staining agent in a vapor state to the photoresist. The method may further include transferring the photoresist from the supportive structure to a copper net coated with a carbon-film after the forming of the photoresist.

The staining process has various embodiments. In one embodiment, the staining of the photoresist includes applying vapor $RuO_4$ at a temperature less than about 70 C to the photoresist for less than about 30 minutes. In another embodiment, the staining of the photoresist includes applying liquid $RuO_4$ at a temperature ranging between about 15 C and about 25 C to the photoresist for less than about 10 minutes. In another embodiment, the staining of the photoresist includes applying vapor $OsO_4$ at a temperature less than about 70 C to the photoresist for less than about 48 hours. In another embodiment, the staining of the photoresist includes applying liquid $OsO_4$ at a temperature ranging between about 15 C and about 25 C to the photoresist for less than about 60 minutes. In another embodiment, the staining of the photoresist includes applying vapor $I_2$ at a temperature less than about 50 C to the photoresist for less than about 3 hours. In another embodiment, the staining of the photoresist includes applying liquid $I_3^-$ at a temperature ranging between about 15 C and about 25 C to the photoresist for less than about 60 minutes. In another embodiment, the staining of the photoresist includes applying liquid uranyl acetate at a temperature less than about 60 C to the photoresist for less than about 60 minutes. In another embodiment, the staining of the photoresist includes applying liquid lead citrate at a temperature less than about 60 C to the photoresist for less than about 60 minutes.

The present disclosure also provides another embodiment of a method for photoresist characterization. The method includes forming a photoresist between two protective material layers; wrapping the photoresist and the two protective layers by an epoxy material; slicing the photoresist, the two protective layers and the epoxy material; and characterizing the photoresist for depth profile with at least one of transmission electron microscope (TEM), scanning electron microscope (SEM), atomic force microscope (AFM), small angle X-ray scattering (SAXS), laser diffraction particle analyzer, and combinations thereof. In one embodiment, each of the two protective layers includes polymer. In furtherance of the embodiment, each of the two protective layers may include a material selected from the group consisting of polystyrene, epoxy, and combinations thereof.

The foregoing has outlined features of several embodiments so that those skilled in the art may better understand the foregoing detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for photoresist characterization, comprising:
   providing a photoresist onto a supportive structure; and
   characterizing the applied photoresist using a metrology tool selected from the group consisting of a transmission electron microscope (TEM), a scanning electron microscope (SEM), an atomic force microscope (AFM), a small angle X-ray scattering (SAXS) and a laser diffraction particle analyzer;
   wherein the providing the photoresist includes:
      forming the photoresist positioned between two protective material layers;
      wrapping the photoresist and the two protective layers by an epoxy material; and
      slicing the photoresist, the two protective layers and the epoxy material.

2. The method of claim 1, wherein the supportive structure comprises a substrate selected from the group consisting of a silicon wafer, a glass, a multilayer film, a copper net coated with a carbon film.

3. The method of claim 1, wherein providing the photoresist on a supportive structure comprises forming the photoresist in a sample cell being capable of hold the photoresist in liquid state and being compatible to the metrology tool.

4. The method of claim 1, further comprising
   baking the photoresist to remove a solvent in the photoresist, before the characterizing of the photoresist.

5. The method of claim 1, further comprising
   staining the photoresist using a staining agent before the characterizing of the photoresist.

6. The method of claim 1, wherein characterizing the photoresist comprises characterizing at least one of photoresist film, photoresist solution, photo-acid generator (PAG) size, PAG distribution, quencher size, quencher distribution, other additive size and distribution, and photoresist solubility.

7. The method of claim 6, wherein characterizing the photoresist comprises at least one of
   characterizing the photoresist in two-dimension from a top view; and
   characterizing the photoresist for its depth profile from a top view.

8. A method, comprising:
   forming a photoresist on a supportive structure;
   baking the formed photoresist;
   staining the formed photoresist with a staining agent; and
   characterizing the formed photoresist using at least one of a transmission electron microscope (TEM), a scanning electron microscope (SEM) and an atomic force microscope (AFM).

9. The method of claim 8, wherein the baking of the photoresist comprises:
   a baking temperature ranging between about 70 C and about 150 C; and
   a baking duration less than about 2 minutes.

10. The method of claim 8, wherein the staining agent is selected from the group consisting of $RuO_4$, $OsO_4$, $I_2$, $I_3^-$, uranyl acetate, lead citrate, and combinations thereof.

11. The method of claim 8, wherein the staining of the photoresist comprises applying the staining agent in a liquid state to the photoresist.

12. The method of claim 8, wherein the staining of the photoresist comprises applying the staining agent in a vapor state to the photoresist.

13. The method of claim 8, wherein the staining of the photoresist comprises applying vapor $RuO_4$ at a temperature less than about 70 C to the photoresist for less than about 30 minutes.

14. The method of claim 8, wherein the staining of the photoresist comprises applying liquid $RuO_4$ at a temperature ranging between about 15 C and about 25 C to the photoresist for less than about 10 minutes.

15. The method of claim 8, wherein the staining of the photoresist comprises applying vapor $OsO_4$ at a temperature less than about 70 C to the photoresist for less than about 48 hours.

16. The method of claim 8, wherein the staining of the photoresist comprises applying liquid $OsO_4$ at a temperature ranging between about 15 C and about 25 C to the photoresist for less than about 60 minutes.

17. The method of claim 8, wherein the staining of the photoresist comprises applying vapor $I_2$ at a temperature less than about 50 C to the photoresist for less than about 3 hours.

18. The method of claim 8, wherein the staining of the photoresist comprises applying liquid $I_3^-$ at a temperature ranging between about 15 C and about 25 C to the photoresist for less than about 60 minutes.

19. The method of claim 8, wherein the staining of the photoresist comprises applying liquid uranyl acetate at a temperature less than about 60 C to the photoresist for less than about 60 minutes.

20. The method of claim 8, wherein the staining of the photoresist comprises applying liquid lead citrate at a temperature less than about 60 C to the photoresist for less than about 60 minutes.

21. The method of claim 8, further comprising transferring the photoresist from the supportive structure to a copper net coated with a carbon-film after the forming of the photoresist.

22. A method, comprising:
    forming a photoresist between two protective material layers;
    wrapping the photoresist and the two protective layers by an epoxy material;
    slicing the photoresist, the two protective layers and the epoxy material; and
    characterizing the photoresist for depth profile with at least one of transmission electron microscope (TEM), scanning electron microscope (SEM), atomic force microscope (AFM), small angle X-ray scattering (SAXS), laser diffraction particle analyzer, and combinations thereof.

23. The method of claim 22, wherein each of the two protective layers comprises a material selected from the group consisting of polymer, polystyrene, epoxy, and combinations thereof.

* * * * *